United States Patent [19]

Lin

[11] Patent Number: 5,530,707
[45] Date of Patent: Jun. 25, 1996

[54] AREA-EFFICIENT DECODERS FOR RATE-K/N CONVOLUTIONAL CODES AND OTHER HIGH RATE TRELLIS CODES

[75] Inventor: Horng-Dar Lin, Holmdel, N.J.

[73] Assignee: AT&T Corp., Murray Hill, N.J.

[21] Appl. No.: 208,542

[22] Filed: Mar. 9, 1994

[51] Int. Cl.$^6$ ................................................. H03M 13/12
[52] U.S. Cl. ........................................................... 371/43
[58] Field of Search ................................ 371/43, 44, 45, 371/46

[56] References Cited

U.S. PATENT DOCUMENTS 4,730,322  3/1988  Pollara-Bozzola .......................... 371/43
5,068,859  11/1991  Collins et al. ............................. 371/43

OTHER PUBLICATIONS

Meier, S., "A Yiterbi Decoder Architecture Based on Parallel Processing Elements", *Globecom '90*, 1990, pp. 1323–1327.
Summerfield, S., "VLSI Design of Rate 2/3 Viterbi Decoder", *IEE Collog.* No. 206, 1992, pp. 8/1–8/4.
Feygin, G. et al., "A Multiprocessor Architecture for Viterbi Decoders with Lineas Speedup", *IEEE Trans. on Signal Processing*, vol. 41, No. 9, Sep. 1993, pp. 2907–2917.
Biver, M., et al., "In–Place Updating of Path Metrics in Viterbi Decoders", *IEEE Jnl. of Solid–State Circuits*, vol. 24, No. 4, pp. 1158–1160, Aug. 1989.
Black, P. J. and Meng, T. H.—Y., "A 140Mb/s 32–State Radix–4 Viterbi Decoder", 1992 International Solid–State Circuits Conference, pp. 70–71, 247, Feb. 1992.
Blahut, R. E., "Theory and Practice of Error Control Codes", pp. 382–388, Addison–Wesley, Reading, Mass., 1983.
Calderbank, A. R., and Sloane, N. J. A., "New Trellis Codes Based on Lattices and Cosets", IEEE Transactions on Information Theory, vol. IT–33, pp. 177–195, No. 2, Mar. 1987.
Collins, O. and Pollara, F., "Memory Management in Traceback Viterbi Decoders", TDA Progress Report 42–99, Jet Propulson Laboratory, pp. 98–104, Nov. 15, 1989.

Cypher, R. and Shung, C. B., "Generalized Trace Back Techniques for Survivor Memory Management in the Viterbi Algorithm", Proceedings of GlobeCom 1990, pp. 1318–1322, IEEE Press, Dec. 1990.
Divsalar, D. and Simon, M. K., "Trellis Coded Modulation for 4800–9600 bits/s Transmission Over a fading Mobile Satellite Channel", IEEE Jnl. on Selected Areas in Communication, vol. SAC–5, No. 2, pp. 162–175, Feb. 1987.
Fishburn, J. P. and Finkel, R. A., "Quotient Networks", IEEE Transactions on Computers, vol. C–31, No. 4, pp. 288–295, Apr. 1982.
Forney, G. D., Jr., "The Viterbi Algorithm", Proceedings of the IEEE, vol. 61, No. 3, pp. 268–278, Mar. 1973.
Gulak P. G. and Shwedyk, E., "VLSI Structures for Viterbi Receivers: Part I—General Theory and Applications", IEEE Jnl. on Selected Areas in Communications, vol. SAC–4, No. 1, pp. 142–154, Jan. 1986.

(List continued on next page.)

*Primary Examiner*—Stephen M. Baker

[57] ABSTRACT

The present invention provides a method and apparatus for decoding data which has been encoded using high rate trellis codes, such as rate-k/n convolutional codes. The method of the present invention includes assigning code states to each of a plurality of decoder processing elements; scheduling computation of a plurality of new path metrics within the processing elements using previously-computed path metrics and branch metrics which vary with the encoded data; scheduling access for each of the processing elements to an appropriate set of the previously-computed metrics, such that each of the previously-computed metrics in the appropriate set is accessed in series by a given processing element in order to compute the new path metrics; and using a survivor sequence of path metrics computed in accordance with the scheduling steps to estimate the uncoded data. The path metrics may be efficiently reordered as they are computed to facilitate access thereto for subsequent path metric computation.

17 Claims, 6 Drawing Sheets

OTHER PUBLICATIONS

Gulak, P. G. and Shwedyk, E., "VLSI Structures for Viterbi Receivers: Part II—Encoded MSK Modulation", IEEE Jnl. on Selected Areas in Communications, vol. SAC–4, No. 1, pp. 155–159, Jan. 1986.

Gulak, P. G. and Kailath, T., "Locally Connected VLSI Architectures for the Viterbi Algorithm", IEEE Jnl. on Selected Areas in Communications, vol. 6, No. 3, pp. 527–537, Apr. 1988.

Lin, H–D., et al., "Folded Viterbi Decoders for Convolutional Codes", IEEE VLSI Signal Processing, vol. IV, pp. 381–391, IEEE Press, 1990.

Lin, H–D. and Shung, C. B., "General In–Place Scheduling for the Viterbi Algorithm", Proceedings ICASSP–91, Toronto, Canada, May 14–17, 1991.

Parhi, K. K., "Systematic Synthesis of DSP Data Format Converters Using Life–Time Analysis and Forward–Backward Register Allocation", IEEE Transactions on Circuits and Systems–II: Analog and Digital Signal Processing, vol. 39, No. 7, pp. 423–440, Jul. 1992.

Parhi, K. K., "Video Data Format Converters Using Minimum Number of Registers", IEEE Transactions on Circuits and Systems for Video Technology, vol. 2, No. 2, pp. 255–267, Jun. 1992.

Rader, C. M., "Memory Management in a Viterbi Decoder", IEEE Transactions on Communications, vol. Com–29, No. 9, pp. 1399–1401, Sep. 1981.

Rahman, A. and Elhakeem, A. K., "Concatenated Combined Modulation and Coding of Frequency Hopping Multiaccess Systems", IEEE Jnl. on Selected Areas in Communications, vol. 8, No. 4, pp. 650–662, May 1990.

Shung, C. B., et al., "Area–Efficient Architectures for the Viterbi Algorithm–Part I: Theory", IEEE Transactions on Communications, vol. 41, No. 4, pp. 636–644, Apr. 1993.

Shung, C. B., et al., "Area–Efficient Architectures for the Viterbi Algorithm", Proceedings of GlobeCom 1990, pp. 1787–1793, IEEE Press 1990.

Sparso, J., et al., "An Area–Efficient Topology for VLSI Implementation of Viterbi Decoders and Other Shuffle–Exchange Type Structurs", IEEE Jnl. of Solid–State Circuits, vol. 26, No. 2, pp. 90–97, Feb. 1991.

Ungerboeck, G., "Channel Coding with Multilevel/Phase Signals", IEEE Transactions on Information Theory, vol. IT–28, No. 1, pp. 55–67, Jan. 1982.

Step 1: Slot size = 8, step size = 6

Step 2: Slot size = 4, step size = 3

Step 3: Process complete

Step 1a: Slot size = 8, step size = 2, collect

Step 1b: Slot size = 8, step size = 4, move

Step 2a: Slot size = 4, step size = 1, collect

Step 2b: Slot size = 4, step size = 2, move

Step 3: Process complete

AREA-EFFICIENT DECODERS FOR RATE-K/N CONVOLUTIONAL CODES AND OTHER HIGH RATE TRELLIS CODES

BACKGROUND OF THE INVENTION

1. Field of the Invention

The present invention relates generally to improvements in decoding encoded data. More particularly, the present invention relates to improvements in decoding data which has been encoded using rate-k/n convolutional codes or other high rate trellis codes.

2. Description of Prior Art

In many data processing applications, it is often desirable to encode a data stream using trellis codes or other data encoding techniques. For example, in digital communication systems, trellis coding of modulation data, when combined with an appropriate mapping of the encoded data to a transmitted signal set, can improve the signal-to-noise ratio of a received signal without an increase in transmitted signal power or bandwidth. See G. Ungerboeck "Channel Coding with Multilevel/Phase Signals," IEEE Transactions on Information Theory, Vol. IT-28, pp. 55–67, January 1982, which is incorporated by reference herein. The signal-to-noise improvement attributable to data encoding is referred to as coding gain, and results in increased bandwidth efficiency. The above-cited Ungerboeck article demonstrates that rate $n/(n+1)$ trellis codes which are mapped into a $2^{n+}$-point signal set can provide significant coding gain when compared to uncoded $2^n$-point signal sets. The amount of coding gain achieved in a given application depends upon a number of factors, including the code rate and the number of states in the code. In general, the code rate is a function of the number of uncoded data bits used to generate each sequence of code bits, while the number of states in the code may be a function of, for example, the number of storage elements in the encoder memory.

Rate-k/n convolutional codes are one type of high rate trellis code. In rate-k/n convolutional codes, a group of k uncoded data bits, also called a data symbol, is encoded using n code bits, collectively referred to as a code symbol. Rate-k/n encoders include an encoder memory which operates as a shift register. Trellis codes are a more general class of codes in which state transitions may be diagrammed in the form of a trellis, but which do not necessarily exhibit shift register-like characteristics. Low rate codes include rate-1/n convolutional codes, in which each one-bit data symbol is encoded using an n-bit code symbol. For both high and low rate codes, the encoded data is often decoded using hardware which implements the well-known Viterbi maximum-likelihood algorithm described in, for example, G. D. Forney, Jr., "The Viterbi Algorithm," Proceedings of the IEEE, pp. 268–278, March 1973, which is incorporated by reference herein. The Viterbi algorithm is a recursive solution to the problem of estimating the state sequence of a finite-state Markov process. In a Markov process, such as the process of encoding data using convolutional codes, the probability of being in a given state $x_{t+1}$ at time t+1 depends only on the state $x_t$ at time t, referred to herein as the predecessor state. The Viterbi algorithm provides optimal decoding in the sense that, for a given set of encoded data, it finds the maximum-likelihood path through a trellis of possible state transitions.

A number of area-efficient decoder designs, which attempt to minimize the circuit area required to implement the Viterbi decoding algorithm at a given processing speed, have been developed for low rate codes. See, for example, P. G. Gulak and T. Kailath, "Locally Connected VLSI Architectures for the Viterbi Algorithm," IEEE Journal on Selected Areas in Communications, Vol. 6, No. 3, pp. 527–537, April 1988, and H-D. Lin et al., "Folded Viterbi Decoders for Convolutional Codes," IEEE VLSI Signal Processing, Vol. IV, IEEE Press, 1990, both of which are incorporated by reference herein. High rate codes, however, generally require a substantially more complex set of hardware in order to provide maximum coding gain using, for example, the Viterbi algorithm. As a result, currently available decoders for rate-k/n convolutional codes and other high rate trellis codes typically utilize suboptimal decoding in order to reduce decoder complexity and cost. Exemplary suboptimal decoding algorithms are described in, for example, pp. 382–388 of R. E. Blahut, "Theory and Practice of Error Control Codes," Addison-Wesley, Reading, Mass., 1984, which are incorporated by reference herein. Unfortunately, reductions in decoder hardware complexity from the use of a suboptimal decoding algorithm usually come at the expense of coding gain.

One reason for the excessive hardware complexity is that optimal high rate Viterbi decoders typically utilize processing elements in which path metrics, measuring the likelihood of possible sequences of predecessor states, are accessed and updated in parallel. The updated path metrics are then compared to select the most likely state sequence corresponding to a given set of encoded data. In general, each processing element in a rate-k/n decoder will require $2^k$ parallel metric inputs. In addition, because the total number of decoder processing elements generally increases as a function of the desired coding gain, decoders for high rate codes often include significantly larger numbers of processing elements. As a result, the rate-k/n decoder will typically include more interconnections and occupy a much larger circuit area than a rate-1/n decoder. Area-efficient techniques developed for low rate codes, however, generally do not alleviate the increased circuit area problem which accompanies use of larger numbers of parallel-input processing elements. Under current practice, therefore, it is difficult to achieve the advantages of high rate codes in a cost-effective manner.

As is apparent from the above, a need exists for improved area-efficient decoders for high rate trellis codes. The improved decoders should exhibit reduced hardware complexity without resorting to suboptimal decoding algorithms.

SUMMARY OF THE INVENTION

The present invention provides a method and apparatus for decoding data which has been encoded using high rate trellis codes, such as rate-k/n convolutional codes. In accordance with one aspect of the present invention, a method of decoding a stream of encoded data is provided which includes assigning code states to each of a plurality of decoder processing elements; scheduling computation of a plurality of new path metrics within the processing elements using previously computed path metrics and branch metrics which vary with the encoded data; scheduling access for each of the processing elements to an appropriate set of the previously-computed path metrics, such that each of the previously-computed path metrics in the appropriate set is accessed in series by a given processing element in order to compute the new path metrics; and using a survivor sequence of path metrics computed in accordance with the scheduling steps to estimate the uncoded data. The present invention is particularly well-suited for use with the Viterbi maximum-likelihood decoding algorithm, but may also be used with other decoding algorithms.

In accordance with another aspect of the present invention, code states are assigned to each of a quantity $2^i$ of processing elements by partitioning groups of code states based on a common set of i bits in a binary representation thereof, and assigning to each of the processing elements a partitioned group of code states having a common set of i bits. In one embodiment of the present invention, the set of i bits represents a set of i most significant bits in the binary representation of the code states.

In accordance with an additional aspect of the present invention, the path metric computation and access schedules may offset by i decoder clock cycles the computation of and access to the metrics by each of $2^i$ processing elements, in order to provide each of the processing elements with series access to an appropriate set of previously-computed path metrics.

In accordance with a further aspect of the present invention, the path metrics may be reordered after computation in order to facilitate access thereto for subsequent computations. An exemplary metric reordering method disclosed herein involves dividing data points corresponding to the path metrics into a number of slots, with each of the slots having a slot size indicating the number of slot positions in the slot; applying permutations to the data points such that data points occupying incorrect slot positions are moved to a different slot position; and repeating the steps of dividing the data points into a number of slots and applying permutations, using a different slot size, until a desired ordering of said data points is obtained. In one embodiment of this method, the data points in incorrect positions in one slot are directly moved to different positions in another slot. In another embodiment, the data points are first collected in one slot near a slot boundary and then moved across the boundary to different positions in another slot.

As a feature of the present invention, maximum-likelihood decoding of high rate trellis codes is provided. An increased amount of coding gain may therefore be achieved with a given coding scheme, resulting in improved bandwidth efficiency relative to the suboptimal decoding presently utilized in many high rate decoders.

As another feature of the present invention, the decoder complexity is significantly reduced, resulting in a substantial decrease in the circuit area required to implement the decoder. The present invention therefore provides the bandwidth efficiency advantages associated with high rate codes in a practical and cost-effective manner.

The above discussed features, as well as additional features and advantages of the present invention, will become more readily apparent by reference to the following detailed description and the accompanying drawings.

DETAILED DESCRIPTION

The present invention provides a method and apparatus for decoding data which has been encoded using high rate trellis codes such as, for example, rate-k/n convolutional codes. As used herein, the term "trellis code" refers to any type of code having state transitions which may be modelled in the form of a trellis diagram. Convolutional codes are a particular type of trellis code. The term "high rate" refers to code rates greater than rate-1/n. The term "area-efficient decoder" refers to a decoder implementation which occupies a reduced amount of circuit area, relative to prior art decoders, at a given processing speed. In the following description, a pair of parentheses will be used to denote a binary string. For example, a code state "seven" may be written as (0 0 1 1 1), and a processing element "two" as processing element (1 0). Similarly, an expression of the form (a b c) implies that variables a, b and c take on only binary values.

Although the following description is primarily directed to Viterbi decoding of rate-k/n convolutional codes, it should be understood that this is for illustrative purposes only. The present invention may be readily applied to many other high rate trellis codes. The data reordering techniques disclosed herein may also be applied to non-trellis codes such as, for example, interleave codes. In addition, the present invention may utilize any of a number of different decoding algorithms. Furthermore, the present invention provides advantages in many different decoding applications, including, for example, decoding coded modulation of multilevel/phase signals, maximum-likelihood signal sequence estimation in communication channels with intersymbol interference, digital sequence detection for magnetic storage devices, detection of optically-scanned characters or patterns, and speech recognition.

Figure 1A:
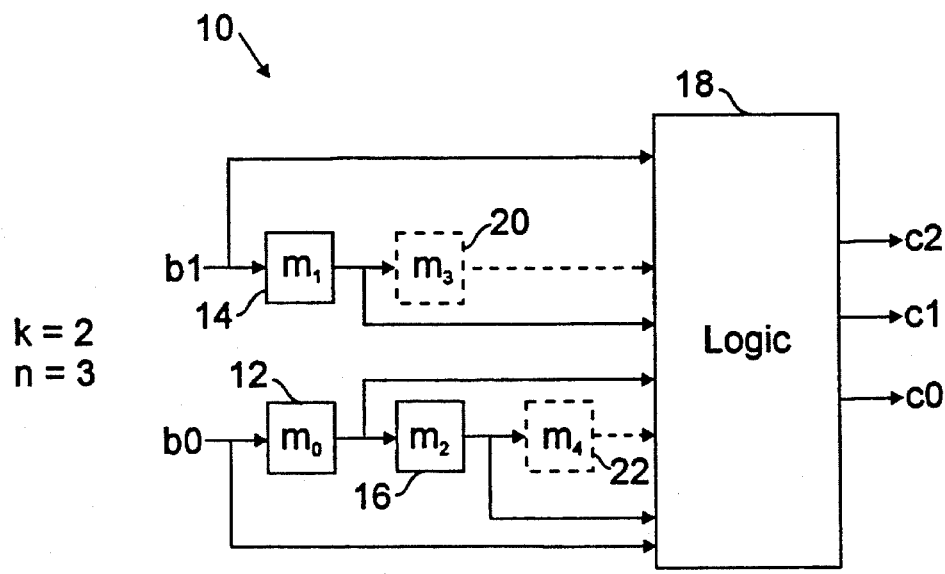
FIG. 1(a) is a block diagram of a conventional rate-k/n convolutional encoder in accordance with the prior art.

FIG. 1(a) shows an exemplary rate-k/n convolutional encoder 10, suitable for encoding a stream of data such that each group of k uncoded data bits, or data symbol, is represented by an n-bit code symbol. In one embodiment, the encoder 10 includes two uncoded data inputs b0, b1, storage elements 12, 14, 16, encoding logic 18, and three coded data outputs c0, c1, and c2. The exemplary encoder 10 produces three coded output bits, collectively referred to as a code symbol, for each group of two uncoded input bits, and is therefore referred to as a rate-2/3 encoder. The storage elements 12, 14, 16 are collectively referred to as the encoder memory. Each storage element typically stores one bit of binary information, and may be, for example, a D-type flip-flop. The contents of the encoder memory determine the state of the encoder, as will be described in greater detail below.

A common encoder clock signal is used to clock uncoded data through each of the storage elements 12, 14, 16 of the encoder 10. The encoder clock signal period is the reciprocal of the encoder symbol rate, and the encoder state is updated using two new inputs b0, b1 during each cycle of the encoder clock signal. The coded outputs c0, c1 and c2 are a logic function of the data clocked out of the storage elements 12, 14, 16, and therefore reflect the encoder state. The particular type of logic function performed within encoding logic 18 will typically vary from encoder to encoder. The storage elements 12, 14, 16 of encoder 10 together operate as a radix-$2^k$ shift register, which contains $2^k$ uncoded data bits at any given time. By contrast, the encoder storage elements for a rate-1/n encoder operate as a binary shift register. As noted above, this shift register-like behavior distinguishes convolutional codes from the more general class of trellis codes.

The storage elements 12, 14, 16, shown in solid outline in FIG. 1(a), correspond to the elements required to implement an 8-state, rate-2/3 encoder. The eight states may be represented in binary form by all possible sequences of the form ($m_2$ $m_1$ $m_0$), where $m_0$, $m_1$, and $m_2$ are the binary contents of the storage elements 12, 14 and 16, respectively. In general, the number of encoder states is $2^j$ where j corresponds to the number of storage elements in the encoder memory. Because there are three storage elements 12, 14, 16 in solid outline in the encoder 10, the solid outline version of encoder 10 has eight possible code states. By including additional storage elements 20, 22, shown in dashed outline in encoder 10, the total number of storage elements j is increased to five, and the encoder 10 then operates as a 32-state, rate-2/3 encoder. The thirty-two code states may be represented by all possible binary sequences of the form ($m_4$ $m_3$ $m_2$ $m_1$ $m_0$), where $m_3$ and $m_4$ are the contents of the additional storage elements 20 and 22, respectively.

Figure 1B:
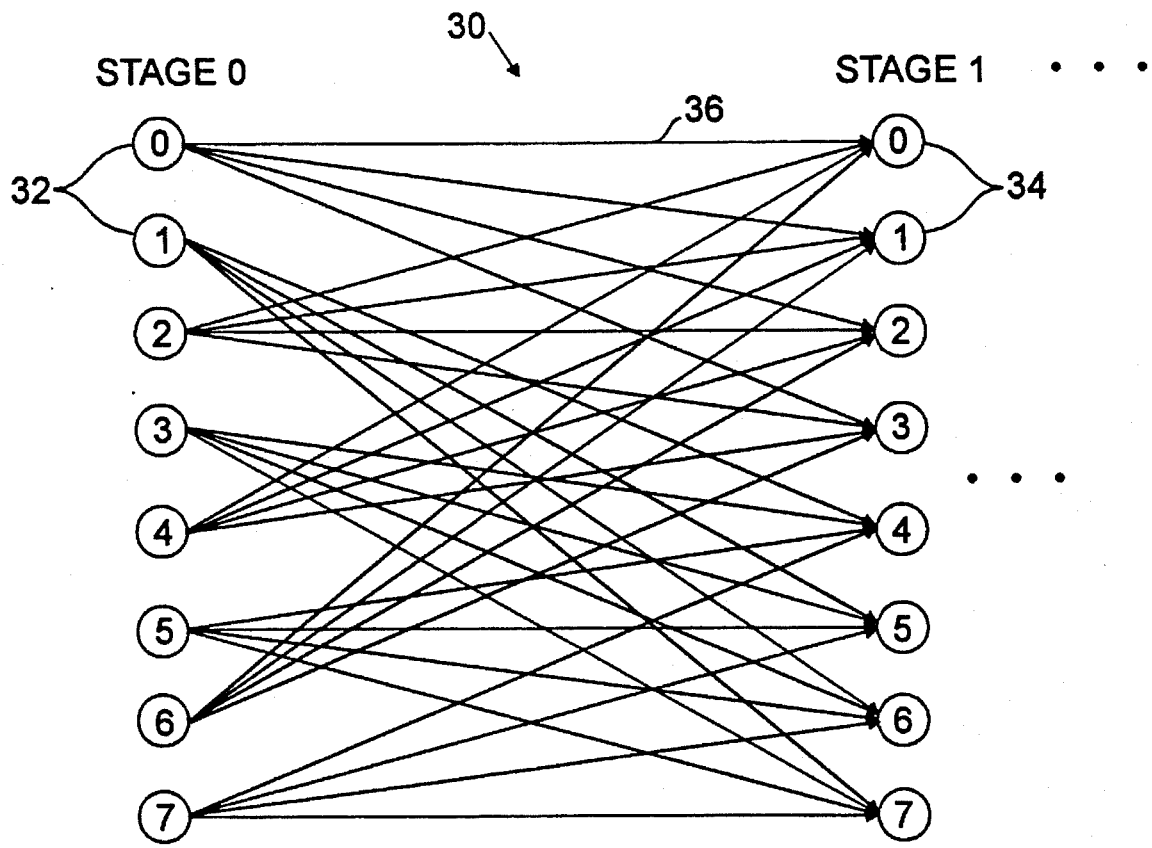
FIG. 1(b) is a trellis diagram corresponding to the prior art convolutional encoder of FIG. 1(a).

FIG. 1(b) shows a trellis diagram 30 corresponding to the 8-state, three storage element version of the encoder 10 in FIG. 1(a). In general, a trellis diagram is a weighted-graph representation of the possible state transitions in a finite-state machine as a function of time. The trellis 30 includes a plurality of nodes 32, 34 interconnected by branches 36. The trellis nodes 32, 34 correspond to possible code states at specific times during the encoding process, while the branches 36 indicate the possible transitions between code states. The first column of nodes 32 represents the eight possible initial states for the 8-state encoding process, and are labeled zero through seven, in accordance with a binary representation of the states. The encoding process is divided into discrete time periods, referred to herein as stages. The initial stage is labelled Stage 0 in FIG. 1(b). Each stage of the process corresponds to one encoder clock cycle, during which new data inputs b0, b1 are received, and new coded data outputs c0, c1, c2 are generated. Based on the data inputs received, the encoder state transitions to one of a number of other nodes in the subsequent stage, represented in Stage 1 of the trellis diagram 30 by nodes 34. For example, if the storage elements 12, 14, 16 each initially contain a binary zero, the encoder 10 is initially in state (0 0 0). If the input data bits b0, b1 received in the next encoder clock cycle are (1 1), the contents of storage elements 12, 14, 16 will be one, one and zero, respectively, and the encoder will be in state (0 1 1). Because there are four possible combinations of input bits b0, b1, there are four possible states, (0 0 0), (0 0 1), (0 1 0) and (0 1 1), to which the encoding process can transition in Stage 1 from the state (0 0 0) in Stage 0. Each branch 36 represents one of the possible transitions from state (000) in Stage 0. Similar branches indicate all other possible state transitions in the encoding process. It can be seen that four branches emanate from state (0 0 0) in Stage 0, indicating that, depending upon the received data, the process may transition from that state to one of the states (0 0 0), (0 0 1), (0 1 0) or (0 1 1) in Stage 1.

The trellis diagram 30 is of the static type, repeating itself for any additional stages as a function of time, and therefore only the first two stages may be shown to fully diagram the process. This is due to the fact that the trellis diagram 30 models a Markov process, convolutional encoding, in which the state at a given time t+1 depends only on the state of the process at the previous time t. The total number of stages in the trellis corresponds to the length of the input data sequence, which in many applications is assumed to be unlimited. It should be noted that trellis diagrams may also be of the dynamic type, for trellis codes in which different stages have different sets of possible state transitions. In general, a static trellis includes $2^j$ nodes in each stage, one for each of the $2^j$ possible states of the Markov process, where j is the number of storage elements in the encoder memory. The trellis for a rate-k/n code includes 2branches from each node, indicating possible transitions from the corresponding state. A rate-1/n code, by contrast, has a trellis with only 2 branches from each node. It can therefore be seen that the trellis complexity is a function of the number of code states and the code rate. A more complex trellis translates to increased hardware complexity in a circuit implementing the corresponding decoding process.

The encoded data from the encoder 10 may be used in any of a number of applications. A common application is digital data transmission, in which the encoded data may be used to, for example, modulate a high frequency carrier signal. At the receiver, the received carrier signal is demodulated and then the recovered encoded data is decoded.

The encoded data may be decoded using a decoding algorithm. The above-mentioned Viterbi algorithm is a maximum-likelihood decoding algorithm particularly well-suited to decoding in the presence of memoryless noise, such as that typically produced in encoded data transmitted over a communication channel. The Viterbi algorithm was originally developed as a technique for detecting convolutionally encoded data, but has since been shown to represent more generally a dynamic programming solution to the problem of finding the shortest path through a weighted graph. The Viterbi algorithm decodes a stream of code symbols by using the encoder trellis diagram to reconstruct the corresponding encoding operations. The code symbol received at stage t+1 is referred to herein as a current code symbol, while the code symbol received at stage t is referred to herein as a previous code symbol. A likelihood measure, referred to herein as a path metric, is computed for each node in a given stage of the trellis. The path metric for a node in stage t+1 is computed recursively by first adding a weighting value, referred to herein as a branch metric, to each of the previously-computed path metrics for all possible predecessor states in the stage t. This operation is often referred to as updating the path metric for a given node. The branch metric indicates the likelihood that the corresponding state transition occurred, and therefore varies depending upon the code symbol received at a given stage. For example, assume a code symbol of (c2 c1 c0), corresponding to an uncoded data symbol (b1 b0) of (1 1), is received at state (0 0 0) in Stage 1 of the trellis 30 in FIG. 1(b). According to the trellis 30, the predecessor state could have been either (0 0 0), (0 1 0), (1 0 0) or (1 1 0). The branch metric for each of these four possible transitions will typically vary such that one of the predecessor states is more likely than the others given the current state and the current code symbol. There are a different set of branch metrics for each code state and for each possible code symbol. These branch metric values may be computed in advance and stored in, for example, a branch metric table, as will be discussed in greater detail below.

After the branch metrics are added to the appropriate set of path metrics for a given trellis node, made up of previously-computed path metrics for each of the possible predecessor states in stage t, the resulting sums for each of the incoming branches are compared. The lowest sum, corresponding to the most likely transition to the given node in stage t+1, is then selected as the new path metric for that node. The process of computing new path metrics for each received code symbol thus generally involves adding branch metrics to a set of previously-computed path metrics, comparing the updated path metrics, and selecting as the new path metric the updated path metric corresponding to the most likely state transition. This path metric computation is typically performed in a decoder processing element.

The sequence of encoded data symbols corresponding to the most likely state transitions through the trellis, which give rise to the new path metric computed at a given node, is referred to as a survivor sequence. The survivor sequence tracks the maximum-likelihood path through the trellis for a given sequence of code symbols, and therefore can be used to estimate a sequence of uncoded data symbols corresponding to the received code symbols. For each node in a given stage of the trellis, both a new path metric and its corresponding survivor sequence are calculated and stored. The new path metrics computed for a current code symbol need only be stored temporarily, until they are used as previously-computed path metrics in computing new path metrics for the next code symbol in the sequence. A memory for storing the survivor sequence may be implemented using any of a number of known techniques. One such technique involves memory traceback, and is described in, for example, R. Cypher and C. B. Shung, "Generalized Trace Back Techniques for Survivor Memory Management in the Viterbi Algorithm," Proceedings of GlobeCom, December 1990, IEEE Press, pp. 1318–1322, and O. Collins and F. Pollara, "Memory Management in Traceback Viterbi Decoders," TDA Progress Report 42–99, Jet Propulsion Laboratory, pp. 98–104, Nov. 15, 1989, both of which are incorporated by reference herein.

As the Viterbi algorithm progresses from stage to stage, computing path metrics for received code symbols, the survivor sequences for nodes in the older stages tend to converge to the maximum-likelihood path. Because the survivor sequence would grow indefinitely long as the decoding process progresses, the sequence may be truncated periodically to remove the oldest estimated data symbols, which may then be used as the decoder output. The algorithm operates recursively, in that new path metrics for each node in stage t+1 are calculated and stored based on the previously-computed path metrics for each possible predecessor state of that node, and the set of branch metrics corresponding to the received encoded data symbol. The algorithm may be initialized by, for example, assuming a path metric value of zero for each node in the initial stage of the trellis, such as the nodes 32 in Stage 0 of the trellis of FIG. 1(b). Additional detail regarding the Viterbi algorithm may be found in, for example, the above-cited article by G. D. Forney, and P. G. Gulak and E. Shwedyk, "VLSI Structures for Viterbi Receivers: Part I—General Theory and Applications," IEEE Journal on Selected Areas in Communications, Vol. SAC-4, No. 1, pp. 142–154, January 1986, which is incorporated by reference herein.

The complexity of hardware used to implement the above-described Viterbi decoding algorithm is a function of the number of code states and possible transitions between them. For example, a typical decoder processing element in a rate-k/n Viterbi decoder must access, update, compare and select from $2^k$ different path metrics in order to determine the most likely path between a given trellis node and its $2^k$ possible predecessor nodes. Assuming a unity cost for each path metric access, update and comparison, each decoder processing element for a rate-k/n code is about $0.6 * 2^k$ more expensive than a corresponding processing element for a rate-1/n code. To compare total decoder cost and complexity, the additional cost of each processing element must be further multiplied by the total number of processing elements in the decoder. Because the number of processing elements is typically a function of the number of code states and therefore the desired coding gain, decoder cost and complexity increases substantially in high coding gain applications.

The total number of processing elements may be reduced, without decreasing the number of code states, by utilizing time-sharing of processing elements. However, time-sharing generally results in a reduction in overall decoder processing speed. Decoder design thus typically presents a speed-complexity tradeoff between low speed processing using fewer time-shared processing elements, and high speed parallel processing using, for example, a separate processing element for each code state. The degree of time-sharing is usually specified by a folding factor F, which is the ratio of the number of code states to the number of processing elements. The folding factor indicates how many states per received code symbol for which a given processing element needs to compute path metrics on a time-shared basis. For example, in a decoder for a 512-state code which uses four processing elements, F is 128. If 512 processing elements are used for the 512-state code, there is no folding, or time-sharing, and F is one. In the latter case, the decoder is referred to as a state-parallel decoder.

The folding factor is related to another important decoder parameter, commonly referred to as pipeline depth. Many of the computations required in Viterbi decoding may be pipelined, or performed using latches or other storage elements to temporarily store the intermediate results of distinct functional operations. For example, a pipelined processing element may include a serial arrangement of latches for temporarily storing the intermediate results of the add, compare and select operations involved in path metric computation. Pipeline depth refers to the number of storage elements in the processing element pipeline. In an ideal decoder, in which the decoder hardware is 100% utilized, the processing element pipeline depth is equivalent to the folding factor F. In many practical decoders, however, the pipeline depth is designed to be greater than F in order to compensate for hardware inefficiency resulting from delays and gaps in the flow of processing data through the pipeline. The pipeline clock rate is therefore typically designed to operate more than F times faster than the code symbol rate, which corresponds to the rate at which an n-bit code symbol is generated at the encoder.

The design of an area-efficient decoder in accordance with the prior art generally involves three basic steps. First, each of the code states are mapped, or assigned to, one of the decoder processing elements. Second, the path metric computation for each processing element and the code states assigned to it are scheduled. Finally, appropriate circuit structures are defined for implementing the code state mapping and the computation schedule. The first two steps specify, for each processing element, which and in what order path metrics are accessed and updated. Based on this information, and the state transitions defined in the code trellis structure, the required communications between processing elements can be analyzed and the hardware efficiency determined. For simple codes with small numbers of code states, an exhaustive search may be performed in order to find the combination of mapping and scheduling which is most area-efficient. Such an approach is typically not practical for more complex codes, however, and therefore other types of decoder design techniques have been developed.

Exemplary prior art techniques developed for rate-1/n codes involve, for example, in-place scheduling, metric reordering, and cascade mapping. In-place scheduling for rate-1/n codes is described in, for example, H-D Lin et al., "Folded Viterbi Decoders for Convolutional Codes," IEEE VLSI Signal Processing, Vol. IV, IEEE Press, 1990, M. Biver et al., "In-Place Updating of Path Metrics in Viterbi Decoders," IEEE Journal of Solid-State Circuits, Vol. 24, No. 4, pp. 1158–1160, August 1989, and H-D. Lin and C. B. Shung, "General In-Place Scheduling for the Viterbi Algorithm," Proceedings of ICASSP-91, Toronto, Canada, May 14–17, 1991, all of which are incorporated by reference herein. Metric reordering for rate-1/n codes is described in, for example, C. B. Shung et al., "Area-Efficient Architectures for the Viterbi Algorithm," Proceedings of GlobeCom 1990, IEEE Press, pp. 1787–1793, which is incorporated by reference herein. Cascade mapping for rate-1/n codes is described in, for example, P. G. Gulak and T. Kailath, "Locally Connected VLSI Architectures for the Viterbi Algorithm," IEEE Journal on Selected Areas in Communications, Vol. 6, No. 3, pp. 527–537, April 1988, which is incorporated by reference herein. In-place scheduling for rate-k/n convolutional codes is described in the above-cited H-D. Lin and C. B. Shung article. As noted above, none of these prior art techniques provides sufficient area-efficiency for high rate codes.

The present invention provides a decoder design technique which, in one embodiment, uses $2^i$ pipelined processing elements to construct an area-efficient Viterbi decoder for $2^j$-state, rate-k/n convolutional codes, in which $0<i<j$. The resulting decoder exhibits a considerably reduced complexity, and therefore improved area-efficiency, as compared to decoders developed using prior art techniques.

One aspect of the present invention involves the step of assigning code states to decoder processing elements. Each processing element then computes new path metrics for the code states assigned thereto. In one embodiment, this assignment step involves most significant bit (MSB) based partitioning, to be described in greater detail below, which generally results in uniform communication between processing elements. As noted in conjunction with FIG. 1(a) above, the encoder memory of a $2^j$-state, rate-k/n convolutional code operates as a radix-$2^k$ shift register. Without loss of generality, the following description will assume that the storage elements in the encoder memory are arranged such that the leftmost storage element in the longer series of encoder storage elements is assigned to the least significant bit (LSB) of the code. For example, in encoder 10 of FIG. 1(a), the LSB $m_0$ is assigned to storage element 12. As shown in FIG. 1(a), the content of the radix-$2^k$ shift register can be written as a j-bit binary string $(m_{j-1} \ldots m_1 m_0)$ in which the bits are ordered such that the MSB $m_{j-1}$ is the oldest bit in the register, and the LSB $m_0$ is the most recent bit in the register. The bits of the binary string are identified by the labels $m_4$, $m_3$, $m_2$, $m_1$ and $m_0$ in FIG. 1(a), and correspond to a binary representation of the encoder state. If the k-bit input to the encoder is given by $(b_{k-1} \ldots b_1 b_0)$, the next state of the encoder is given by $(m_{j-k-1} m_{j-k-2} \ldots m_1 m_0 b_{k-1} b_{k-2} \ldots b_1 b_0)$. For example, if the encoder memory content of the 32-state, rate-2/3 version of encoder 10 is given by (a b c d e), and an input $(b_1 b_0)$ of (f g) is received, the next encoder state is (c d e f g). The assignment of code states to processing elements also defines a configuration for the processing element network within the decoder.

Figure 2B:
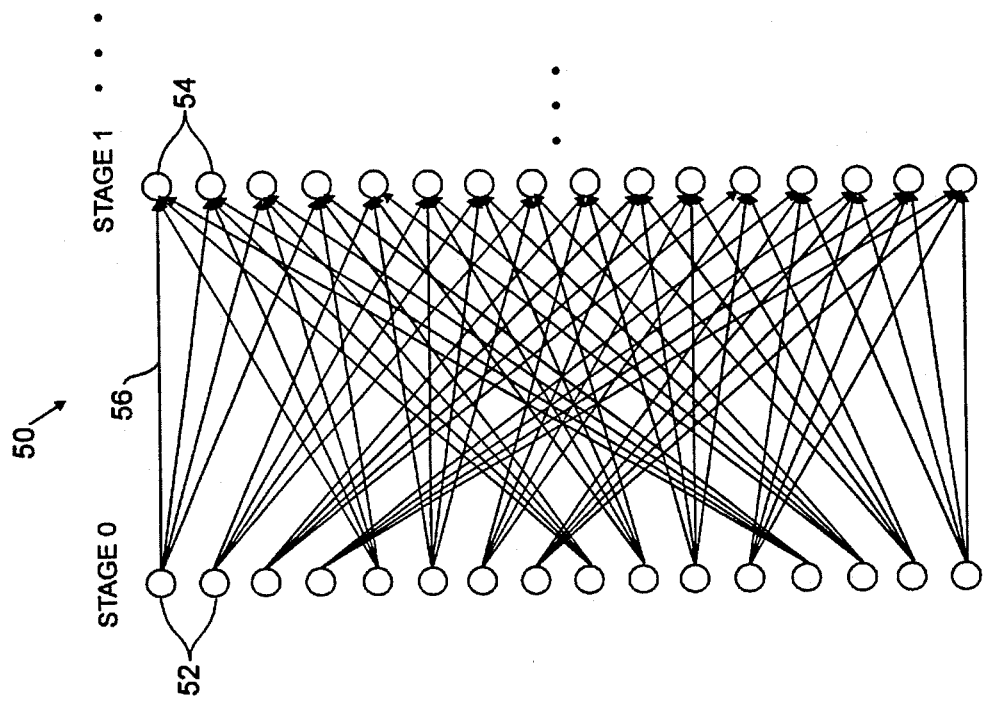
FIGS. 2(b), 3(b) and 4(b) are trellis diagrams corresponding to the decoders of FIGS. 2(a), 3(a) and 4(a), respectively.
Figure 2A:
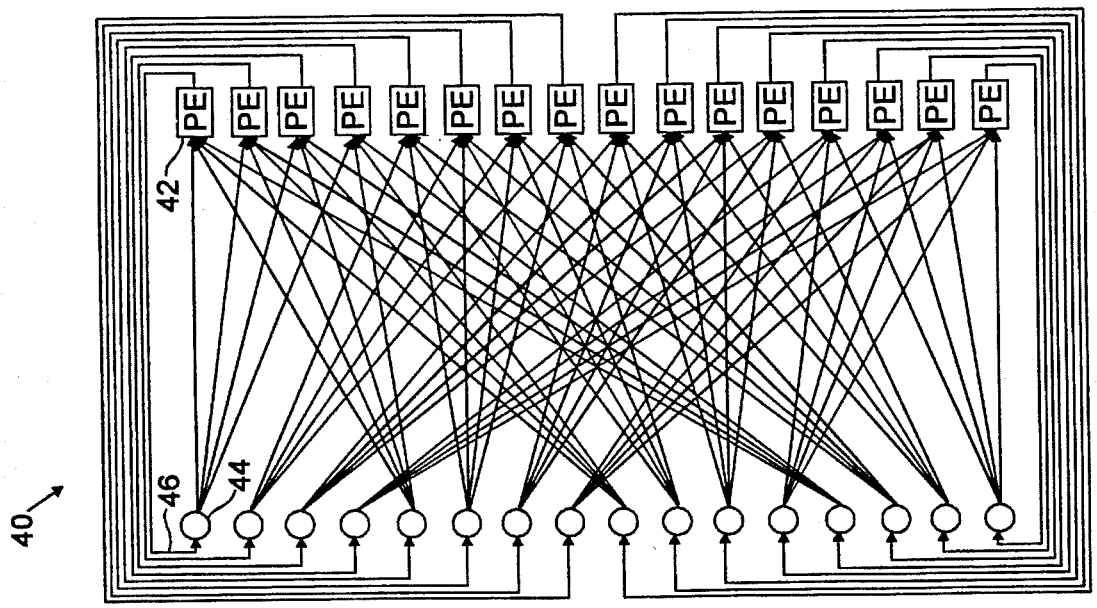
FIGS. 2(a), 3(a) and 4(a) are block diagrams of exemplary 32-state, rate-2/3 decoders in accordance with the present invention, with folding factors of 2, 4 and 16, respectively.
Figure 3B:
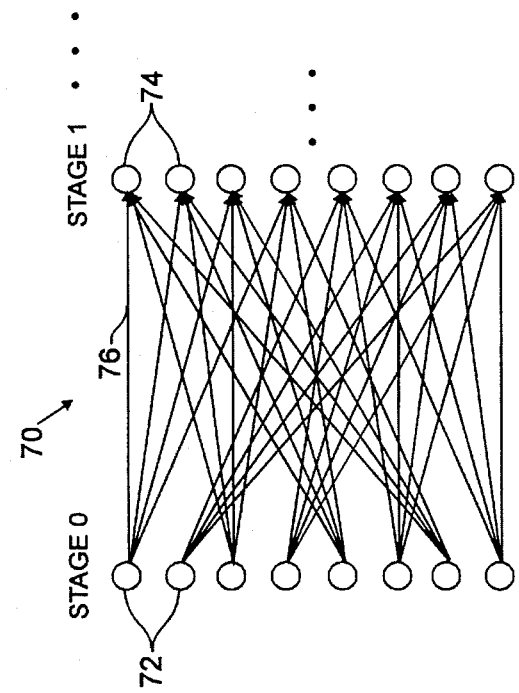
Figure 4B:
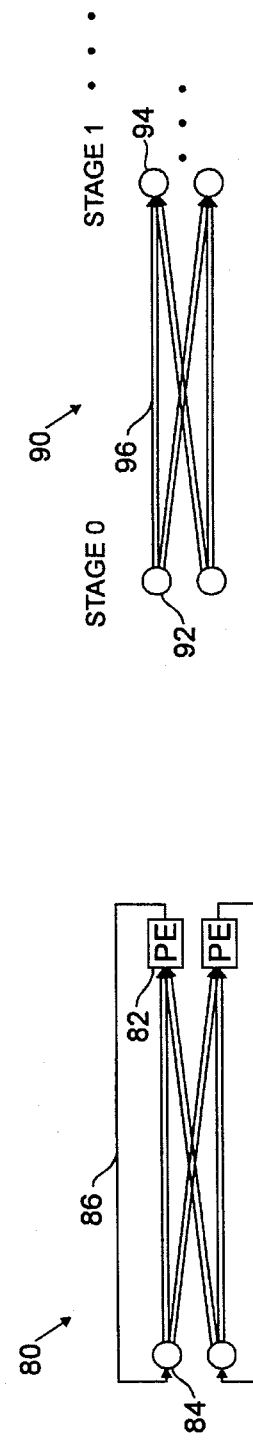

FIGS. 2 through 4 illustrate several exemplary 32-state, rate-2/3 decoders in accordance with the present invention, and their corresponding trellis diagrams. FIG. 2(a) shows a decoder 40 which includes sixteen processing elements 42. The output of each processing element 42 is connected to one of sixteen path metric output distribution nodes 44 via an interconnect line 46. Each distribution node 44 is also connected to the inputs of four different processing elements 42. The path metric distribution nodes distribute outputs from each processing element to other processing elements, in accordance with path metric computation and access schedules to be discussed below. A corresponding trellis diagram 50 in FIG. 2(b) includes sixteen Stage 0 trellis nodes 52, each interconnected to four of sixteen Stage 1 trellis nodes 54 by a branch 56. The decoder 40 of FIG. 2(a) includes 16 processing elements, and therefore has a folding factor of two when used for a 32-state code. Each node in the trellis 50 thus represents two different code states. It should be noted that the decoder 40 also represents a state-parallel decoder for a less complex 16-state, rate-2/3 code. As noted above, a state-parallel decoder is one in which each code state is assigned to one processing element such that the decoder folding factor is one.

Figure 3A:
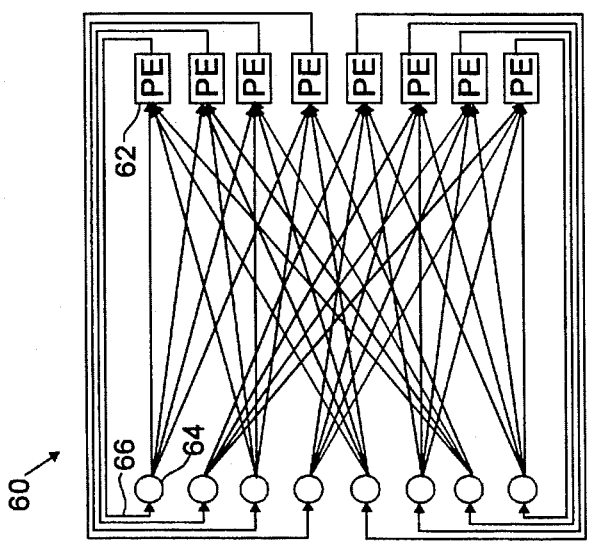

The decoder 60 shown in FIG. 3(a) includes eight processing elements 62, each with an output connected to one of eight path metric distribution nodes via an interconnect line 66. The decoder 60 has a folding factor of four when used for a 32-state code, and thus corresponds to a state-parallel decoder for an 8-state rate-2/3 code. A corresponding trellis diagram 70 includes eight Stage 0 nodes 72, each connected to four Stage 1 nodes 74 via a branch 76. The decoder 80 shown in FIG. 4(a) includes two processing elements 82, each with an output connected to one of two path metric distribution nodes via an interconnect line 86, and therefore has a folding factor of sixteen when used for a 32-state code. The decoder 80 is thus fully interconnected and there is no corresponding 2-state, rate-2/3 code. In a fully interconnected decoder, each processing element is connected to each path metric distribution node. It should be noted that the decoder 80 of FIG. 4(a) includes pairs of double lines between each of the metric distribution nodes 84 and the processing elements 82. Each pair of double lines in the decoder 80 indicates that two metrics are being distributed from each of distribution node to each processing element. In an actual decoder implementation, a single interconnection line could be used to transfer both metrics. A corresponding trellis diagram 90 includes two Stage 0 nodes 92, each connected to two Stage 1 nodes 94 via a pair of double lines 96.

In general, for $2^j$-state, rate-k/n codes, area-efficient decoders of the present invention with $2^i$ processing elements, where $i \geq k$, have a configuration which corresponds to a state-parallel decoder for a $2^i$-state, rate-k/n code. If $i<k$, the decoder configuration corresponds to that of a fully interconnected network of $2^i$ processing elements. The decoders of the present invention may therefore be re-used for other rate-k/n codes with different numbers of code states.

As noted above, the assignment of code states to decoder processing elements in accordance with the present invention may be based upon, for example, an MSB partitioning of code states. Under MSB partitioning, if $2^i$ processing elements are used to decode a $2^j$-state, rate-k/n convolutional code, a group of code states having a common set of i MSBs are assigned to the same processing element. As an example, assume that a decoder with four processing elements, such that i is two, is used to decode a 32-state, rate-k/n code. The code state assignment in accordance with the present invention may then be based on the two MSBs of the given state. The binary representations of the code states are thus partitioned into four groups, (0 0 x x x), (0 1 x x x), (1 0 x x x) and (1 1 x x x), where x represents a "don't care" value. Each group of code states is then assigned to one of the four decoder processing elements. It should be noted that the assignment of code states may also be based upon common sets of i bits other than the i MSBs. In addition, although each group need not include the same number of code states, at least one different code state will generally be assigned to each of the processing elements. For simplicity, individual processing elements may be identified in the following description by the i MSBs of the states assigned to it. For example, processing element (0 0), or PE (0 0), processes code states 0 through 7, PE (0 1) processes code states 8 through 15, and so on.

Under the above-described assignment of code states to processing elements, the communication between processing elements is substantially uniform. For example, in a four processing element decoder for the 32-state, rate-2/3 version of encoder 10 in FIG. 1(a), the predecessor states of state (a b c d e) are states (0 0 a b c), (0 1 a b c), (1 0 a b c) and (1 1 a b c). State (a b c d e) is computed by PE (a b) while its predecessor states are computed by PE (0 0), PE (0 1), PE (1 0) and PE (1 1), respectively. PE (a b) thus always accesses a path metric generated by each of the four processing elements in the decoder before computing a path metric for an assigned state. Similar uniform communication among the four processing elements is obtained for all values of (a b), regardless of the value of (c d e). In more general terms, when $2^i$ processing elements are used to decode a $2^j$-state, rate-k/n convolutional code, the predecessor states of state $(m_{j-1} \ldots m_1 m_0)$ are $(z_{k-1} \ldots z_1 z_0 m_{j-1} \ldots m_{k+1} m_k)$ for all possible values of $z_0, z_1, \ldots z_{k-1}$. The processing element communication pattern depends on the relative values of i and k. If i<k, PE $(d_{i-1} \ldots d_1 d_0)$ accesses $2^{k-i}$ path metrics from each of the $2^i$ processing elements. If i≥k, PE $(d_{i-1} \ldots d_1 d_0)$ accesses one path metric from each of the $2^i$ processing elements PE $(z_{k-1} \ldots z_1 z_0 d_{i-1} \ldots d_{k+1} d_k)$, for all possible values of $z_0, z_1 \ldots z_{k-1}$. In either case, the communication pattern for each processing element is independent of the specific group of code states assigned to a particular PE $(d_{i-1} \ldots d_1 d_0)$.

Another aspect of the present invention involves determining path metric access and computation schedules for each of the processing elements in the decoder. As noted above, the $2^j$ code states may be partitioned and assigned based on, for example, a common set of i MSBS, to decoder processing elements. Each of the $2^i$ processing elements is used to compute path metrics for F states on a time-shared basis, where F is the folding factor, equivalent to $2^{j-i}$. More specifically, PE $(d_{i-1} \ldots d_1 d_0)$ computes path metrics for code states $(d_{i-1} \ldots d_1 d_0 z_{j-i-1} \ldots z_1 z_0)$, for all possible values of $z_0, z_1 \ldots z_{k-1}$. One possible path metric computation schedule follows an ascending order of code states. Table 1 below shows an exemplary path metric computation schedule, based on ascending code states, for a 32-state, rate-2/3 code and a four processing element decoder.

TABLE 1

| PE Number | Code State Assignment | Schedule for computing metrics | | | | | | | |
|---|---|---|---|---|---|---|---|---|---|
| | | t0 | t1 | t2 | t3 | t4 | t5 | t6 | t7 |
| 0(00) | (00xxx) | 0 | 1 | 2 | 3 | 4 | 5 | 6 | 7 |
| 1(01) | (01xxx) | 8 | 9 | 10 | 11 | 12 | 13 | 14 | 15 |
| 2(10) | (10xxx) | 16 | 17 | 18 | 19 | 20 | 21 | 22 | 23 |
| 3(11) | (11xxx) | 24 | 25 | 26 | 27 | 28 | 29 | 30 | 31 |

In Table 1, the times t0 to t7 represent clock cycles in the decoder. Each processing element computes a new path metric for one code state during each decoder clock cycle. The decoder clock cycles t0 to t7 repeat for each received code symbol. The numbers in each row represent the code state for which a new path metric is computed in a particular processing element during a given decoder clock cycle. For example, PE (0 0), which has been assigned code states (0 0 x x x) in the state partitioning, computes new path metrics for code states 0, 1, 2, 3, 4, 5, 6 and 7 in ascending order over eight decoder clock cycles. The folding factor F for this exemplary 32-state, four processing element decoder is eight. There are eight decoder clock cycles t0 to t7 shown in Table 1 because F is eight and each processing element therefore computes, for each received code symbol, new path metrics for eight different code states on a time-shared basis.

In order to compute path metrics for the code states identified in Table 1, each processing element must access an appropriate set of previously-computed path metrics, including previously-computed path metrics for the predecessor states of the code states assigned to that processing element. The previously-computed path metrics are those computed for a previous code symbol in the stream of code symbols received in the decoder. The new path metrics computed for a current code symbol will thus serve as previously-computed path metrics for the next code symbol in the stream. As noted above, to compute the new path metric for a state (a b c d e), the processing element PE (a b) needs to access path metrics associated with predecessor states (0 0 a b c), (0 1 a b c), (1 0 a b c) and (1 1 a b c). Table 2 below shows this exemplary access schedule for 32-state, rate-2/3 decoder with four processing elements. For clarity, the set of previously-computed path metrics which a given processing element needs to access will be enclosed within brackets in the following discussion. In general, Table 2 below indicates that PE (a b) needs to access previously-computed path metrics [(0 0 a b c), (0 1 a b c), (1 0 a b c), (1 1 a b c)] in ascending order of (c d e). Therefore, PE (a b) accesses the set of path metrics [(0 0 a b 0), (0 1 a b 0), (1 0 a b 0), (1 1 a b 0)] for decoder clock cycles t0 to t3, and then the set of path metrics [(0 0 a b 1), (0 1 a b 1), (1 0 a b 1), (1 1 a b 1)] for decoder clock cycles t4 to t7. For example, PE (0 0) accesses path metrics [(0 0 0 0 0), (0 1 0 0 0), (1 0 0 0 0), (1 1 0 0 0)], or [0, 8, 16, 24], for decoder clock cycles t0 to t3, in order to compute new path metrics for states 0, 1, 2 and 3. States 0, 8, 16, and 24 are the predecessor states of states 0, 1, 2 and 3 in a 32-state, rate-2/3 trellis. Similarly, states 1, 9, 17 and 25 are the predecessor states of states 4, 5, 6 and 7. The access schedule in Table 2 indicates the appropriate set of predecessor states for each of the 32 code states in Table 1 for which path metrics are computed. The set of decoder clock cycles t0 through t8 may also be referred to as a code symbol period, because the cycles are repeated for each received code symbol.

and access schedules of Tables 3 and 4, respectively. In this example, the PE (0 0) schedules are unchanged, and the PE (0 1), PE (1 0) and PE (1 1) schedules are offset in time by one, two and three decoder clock cycles, respectively.

TABLE 3

| | Schedule for computing metrics | | | | | | | | Schedule for computing metrics | | | | | | | |
|---|---|---|---|---|---|---|---|---|---|---|---|---|---|---|---|---|
| PE | t0 | t1 | t2 | t3 | t4 | t5 | t6 | t7 | t0' | t1' | t2' | t3' | t4' | t5' | t6' | t7' |
| 0 | 0 | 1 | 2 | 3 | 4 | 5 | 6 | 7 | | | | | | | | |
| 1 | | 8 | 9 | 10 | 11 | 12 | 13 | 14 | 15 | | | | | | | |
| 2 | | | 16 | 17 | 18 | 19 | 20 | 21 | 22 | 23 | | | | | | |
| 3 | | | | 24 | 25 | 26 | 27 | 28 | 29 | 30 | 31 | | | | | |

TABLE 4

| | Schedule for accessing metrics | | | | | | | | Schedule for accessing metrics | | | | | | | |
|---|---|---|---|---|---|---|---|---|---|---|---|---|---|---|---|---|
| PE | t0 | t1 | t2 | t3 | t4 | t5 | t6 | t7 | t0' | t1' | t2' | t3' | t4' | t5' | t6' | t7' |
| 0 | 0 | 8 | 16 | 24 | 1 | 9 | 17 | 25 | | | | | | | | |
| 1 | | 2 | 10 | 18 | 26 | 3 | 13 | 14 | 15 | | | | | | | |
| 2 | | | 4 | 12 | 20 | 28 | 5 | 21 | 22 | 23 | | | | | | |
| 3 | | | | 6 | 14 | 22 | 30 | 7 | 29 | 30 | 31 | | | | | |

TABLE 2

| PE Number | Code State Assignment | Schedule for computing metrics | | | | | | | |
|---|---|---|---|---|---|---|---|---|---|
| | | t0 | t1 | t2 | t3 | t4 | t5 | t6 | t7 |
| 0(00) | (00xxx) | [0, 8, 16, 24] | | | | [1, 9, 17, 25] | | | |
| 1(01) | (01xxx) | [2, 10, 18, 26] | | | | [3, 11, 19, 27] | | | |
| 2(10) | (10xxx) | [4, 12, 20, 28] | | | | [5, 13, 21, 2] | | | |
| 3(11) | (11xxx) | [6, 14, 22, 30] | | | | [7, 15, 23, 31] | | | |

It should be noted that in Tables 1 and 2 there is a mismatch between the path metric computation schedule and the path metric access schedule. In Table 2, the previously-computed path metrics accessed by a given processing element were each computed during the same decoder clock cycle in the previous code symbol period. For example, PE (1 1) accesses metrics [6, 14, 22, 30] at clock cycle t0 in the current code symbol period, but these metrics were all computed during clock cycle t6 in the previous code symbol period. As a result, in this embodiment based upon an ascending order of code state values, there may be too few clock cycles to compute and send the path metrics for the previous code symbol to the appropriate processing element to compute new path metrics for the next code symbol. In the case of PE (1 1), only two clock cycles, t6 and t7, are available to compute and send all four path metrics [6, 14, 22, 30], such that PE (1 1) may compute a new path metric for state 24 at clock cycle t0 in the next code symbol period.

Another embodiment of the present invention alleviates the potential timing limitations inherent in metric computation scheduling based on an ascending order of code states. In this other embodiment, the metric computation and access schedules for each processing element are offset in time. The time offset may be accomplished by, for example, offsetting the computation and access schedules of PE (a b) by (a b) decoder clock cycles. For a decoder with $2^i$ processing elements, the computation and access schedules of each processing element are therefore offset by i decoder clock cycles. An exemplary time offset arrangement is illustrated for a 32-state, rate-2/3 decoder in the metric computation The path metric computation and access schedules of Tables 3 and 4 provide each of the processing elements with serial access to the appropriate set of previously-computed metrics, thereby providing improvements over the parallel access schedules of Tables 1 and 2. The operation of PE (0 0) in Table 2 provides an example of parallel path metric access. For example, Table 2 indicates that PE (0 0) must access path metrics [0, 8, 16, 24] in parallel beginning at clock cycle t0 in order to compute new path metrics for states 0, 1, 2 and 3 during clock cycles t0, t1, t2 and t3. This is because the first state for which new path metrics are computed, state 0, requires the previously-computed path metrics from states 0, 8, 16 and 24. In contrast, Table 4 shows that the previously-computed path metrics for states 0, 8, 16 and 24 are accessed serially during clock cycles t0, t1, t2 and t3 while new path metrics are simultaneously computed for states 0, 1, 2 and 3. Similarly, each processing element in the decoder accesses each of the previously-computed path metrics in its set in series. Exemplary processing element designs suitable for use in this serial access embodiment of the present invention will be described below. An advantage of the decoder clock cycle offset and simultaneous metric computation described above is that it tends to smooth out the bursty nature of communications between processing elements and thereby improves hardware efficiency.

Although the potential timing limitations associated with the schedules of Tables 1 and 2 are alleviated by using the timing offset shown in the schedules of Tables 3 and 4, it should be understood that area-efficient high code rate decoders in accordance with the present invention may be constructed based on the schedules of Tables 1 and 2. For example, the pipelined processing elements and metric reordering techniques of the present invention, both to be described in detail below, could be used to provide serial access to previously-computed path metrics without offsetting the decoder clock cycles. Such an embodiment improves the decoder timing by temporarily storing previously-computed or partially-computed path metrics in a pipeline at a given processing element as path metrics are computed at other processing elements.

Another aspect of the present invention involves metric reordering techniques for implementing metric access schedules. The schedules of Tables 3 and 4 illustrate the concept of metric reordering. For example, PE (0 0) computes path metrics in the order 0, 1, 2, 3, 4, 5, 6, 7, but these metrics are accessed by PE (0 0) and the other three processing elements in the order 0, 2, 4, 6, 1, 3, 5, 7. The metric access sequence is thus a four-way interleaving of the metric computation sequence. The other processing elements in Tables 3 and 4 also exhibit access schedules which are four-way interleaved versions of their computation schedules. In order to further improve hardware efficiency, the new path metrics may be reordered after computation so they may be accessed sequentially in accordance with the desired access schedule. The reordering thus facilitates scheduled access for subsequent path metric computations. In the example of Table 4, the computed metrics should be reordered by four-way interleaving. An exemplary prior art technique for performing four-way interleaving involves storing the sequence of computed metrics into a 4×2 memory array in row order, and then accessing the metrics in the desired sequence by reading them out in column order.

In general, for rate-k/n convolutional codes, the desired metric reordering typically involves $2^q$-way interleaving of $2^p$ metrics, where p and q are application-dependent. In a decoder in which i≧k, p is j-i and q is k. For decoders in which i<k, metric reordering will typically involve additional partition and repetition as a result of time-sharing. Transpose memory or other memory or register-based techniques, such as the 4×2 memory array in the above example, may be used to provide $2^q$-way interleaving. Another interleaving technique involves the use of a very large scale integrated (VLSI) structure referred to as a shift exchange unit (SEU). An SEU typically includes a number of pipelined latches and implements fixed-step size permutations of pipeline data, as will be described below in conjunction with FIG. 10. SEUs are described in greater detail in, for example, the above-cited article by C. B. Shung et al. Alternative interleaving techniques could also be used to reorder metrics to provide the access schedules of the present invention.

Metric reordering techniques in accordance with the present inventions, suitable for implementing $2^q$-way interleaving of data points using SEUs or other circuit structures, will now be described. An exemplary decoder for a 64-state, rate-2/3 convolutional code, with four processing elements, will be used to illustrate the exemplary reordering techniques. In this example, j=6, k=2 and i=2. Path metrics for states (a b c d e f) are computed in ascending order of (c d e f) by PE (a b), while path metrics for states (x x a b c d), the predecessor states of states (a b c d e f), are accessed in ascending order of (c d e f) with a time offset (a b). The amount of time offset (a b) is in synchronization with the ascending order of (e f), and the metrics are therefore accessed in synchronization with (x x e f c d). It can thus be seen that, in order to synchronize path metric computation and access sequences, PE (a b) should reorder computed path metrics from the computation sequence (a b c d e f) into the access sequence (a b e f c d), which is equivalent to four-way interleaving of 16 data points. The need for four-way metric interleaving can be seen in the operation of PE (0 0), which computes metrics in the sequence 0, 1, 2, 3, 4, 5, 6, 7, 8, 9, 10, 11, 12, 13, 14, 15, while these metrics are accessed by PE (0 0), and the other processing elements in the decoder, in the sequence 0, 4, 8, 12, 1, 5, 9, 13, 2, 6, 10, 14, 3, 7, 11, 15.

Figure 5:
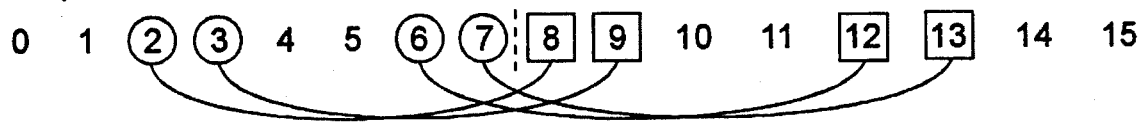
FIG. 5 shows an exemplary set of reordering steps for four-way interleaving of 16 data points using a direct move method in accordance with the present invention.
Figure 5:
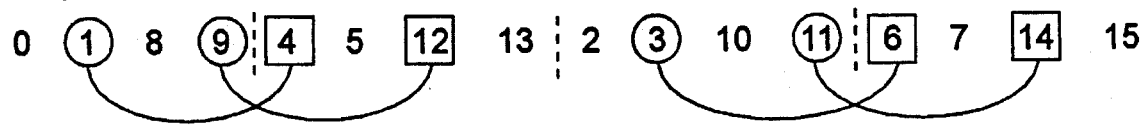
Figure 5:
Figure 6:
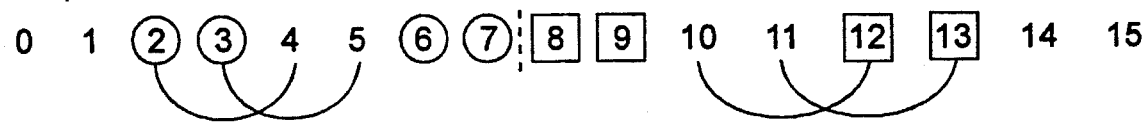
FIG. 6 shows an exemplary set of reordering steps for four-way interleaving of 16 data points using a collect-and-move method in accordance with the present invention.
Figure 6:
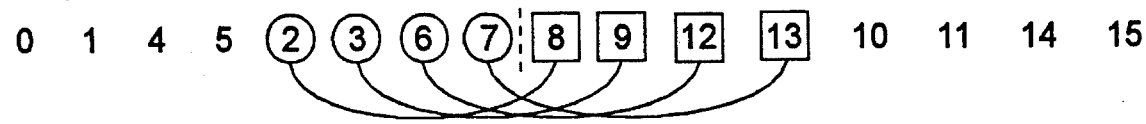
Figure 6:
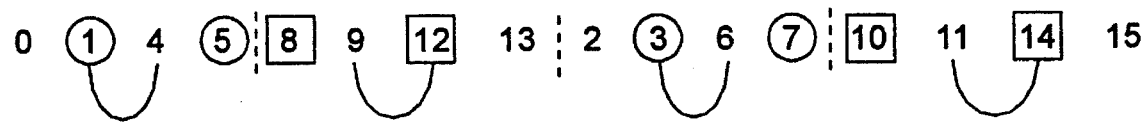
Figure 6:
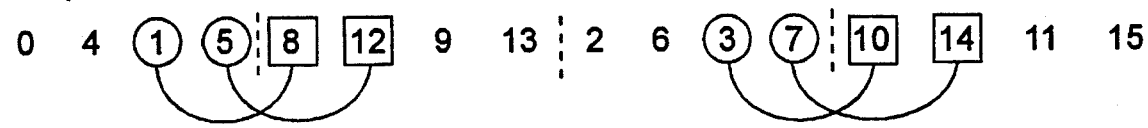
Figure 6:

FIGS. 5 and 6 illustrate two exemplary metric reordering techniques in accordance with the present invention. The metric reordering is demonstrated using the ascending order sequence of 16 path metrics computed by PE (0 0) in an exemplary 64-state, four processing element, rate-2/3 decoder. In general terms, the reordering techniques of the present invention involve the following three steps. First, the set of path metrics computed by a given processing element, or more generally any set of data points which require reordering, are divided into at least two groups, with each group corresponding to a different slot. A slot, as the term is used herein, refers generally to an ordered arrangement of a group of data points. The slots may represent, for example, sequential groups of latches or other temporary storage elements in a decoder processing element. Each of the slots includes a number of slot positions, with each slot position generally occupied by a single data point, such as, for example, a single path metric. Each slot position may therefore correspond to a single temporary storage element in the decoder. The slot size refers to the number of slot positions in a given slot. Although the examples to be described below use slots with the same slot size at each step in the reordering process, the data points may also be divided into a number of different-size slots at a given reordering step. Second, data points stored in certain slot positions in one slot are moved to different slot positions in another slot by applying permutations of a given step size to the data points. The data points to be moved may be those occupying an incorrect slot position in their current slot, and may be identified by comparing a current slot position for each data point to its desired slot position. The permutation step size is the total number of slot positions a given data point is shifted as a result of the move. Finally, the steps of dividing the data points into slots and applying permutations are repeated recursively, using a different slot size, until a desired sequential ordering of data points is achieved. The slot size will typically decrease with each repetition of the reordering steps. Also, the step size will typically change with each new slot size, and several different step sizes could be used for a given slot size, in order to provide desired permutations in the data point ordering.

FIG. 5 illustrates direct move metric reordering in accordance with the present invention. The set of data points shown in each step of the reordering process represents, for example, a set of path metrics computed by a decoder processing element for a given code symbol. The series of data points may be stored in, for example, groups of temporary storage elements. The dashed line divides the set of data points into two groups, or slots, each containing 8 slot positions. In Step 1, the current delta point slot positions are compared to the desired slot positions. Certain data points in incorrect slot positions, as indicated by circles and squares in the first and second slots, respectively, are moved directly to different slot positions in another slot. Step 1 uses fixed-step permutations with a step size of 6, such that each data point moved has been shifted by 6 slot positions. The procedure is then repeated using a smaller slot size, as shown in Step 2 of FIG. 5. In Step 2, the storage elements containing the data points are subdivided into four slots, shown separated by dotted lines. Again, certain data points in incorrect slot positions, designated by circles in the first and third slots and squares in the second and fourth slots, are moved directly to different positions in other slots. In Step 2, fixed-step permutations with a step size of 3 are used. As indicated in Step 3, the movement of data points in Step 2 placed each data point in its correct position, and no further dividing and moving is necessary. Steps 1 and 2 of FIG. 5 thus performed four-way interleaving of 16 data points. In the above example, in which the 16 data points are path metrics computed by PE (0 0) in a 64-state decoder, the path metrics may now be accessed in the desired order by simply reading them sequentially from temporary storage elements or from memory. In the above-described direct move method, the permutation step size is monotonically decreasing. However, for large numbers of data points, the step size, or the number of slot positions certain data points must be moved, is initially very large. A large initial step size may be undesirable in that longer wire lengths may be required in a hardware implementation of the technique using, for example, SEUs.

FIG. 6 illustrates another metric reordering technique, referred to herein as the collect-and-move method, which addresses the long initial step size limitation of the direct move method. In the example shown in FIG. 6, the collect-and-move method splits up each of the longer moves in Steps 1 and 2 of FIG. 5 into two shorter moves. The first of the shorter moves, shown in Step 1a, collects out-of-place data points at adjacent ends of the two storage slots, using a slot size of 8 and a step size of 2. For example, the path metrics 2, 3 in step 1a are switched with path metrics 4, 5, and the path metrics 12, 13 are switched with path metrics 10, 11, in order to collect these out-of-place path metrics near the boundary between the two storage slots. After the data points are collected near the boundary, on adjacent ends of adjacent slots, the second shorter move, shown in step 1b, moves the out-of-place data points across the slot boundary to different positions in the adjacent slot. The process is then repeated using a slot size of 4, as shown in steps 2a and 2b. By Step 3, all data points are in the desired slot positions, and the collect-and-move reordering process in complete. Although well-suited to reordering computed path metrics in a high rate Viterbi decoder, it should be understood that the reordering techniques may be useful in any other application which involves interleaving a plurality of data points.

The above-described direct move and collect-and-move metric reordering may be implemented by, for example, cascading several SEUs that provide fixed-step permutations. Such an implementation is described for rate-1/n convolutional codes in, for example, H-D. Lin et al., "Folded Viterbi Decoders for Convolutional Codes," IEEE VLSI Signal Processing, Vol. IV, IEEE Press, 1990, and the above-cited C. B. Shung et al. article, both incorporated by reference herein. Each of the SEUs provide fixed-step permutations of a given step size. For example, the metric reordering shown in FIG. 5 could be implemented by cascading two SEUs, one providing fixed-step permutations of step size six, and another providing permutations of step size three. The output of the cascaded SEUs will then be the data points in the desired sequence, as shown in Step 3 of FIG. 5. It should therefore be noted that each of the SEUs inherently provide both of the above-described steps of dividing data points into slots and applying permutations. The slot size depends upon the permutation step size of the SEU. The steps of dividing into slots and applying permutations are repeated using a different slot size by passing the data points through an SEU with a different permutation step size.

In general, the number of pipeline latches used in the SEU corresponds to the permutation step size. Hardware complexity may therefore be reduced by choosing a reordering method which gives the minimum sum of permutation step sizes. In the 64-state, rate-2/3 decoder example of FIGS. 5 and 6, direct move results in a step size sum of 6+3=9, while collect-and-move also gives a step size sum of 2+4+1+2=9. It should be understood, however, that in many other applications the step size sums in each method will be different.

For example, four-way interleaving of eight data points will result in a step size sum of 3+1=4 using the direct move method, and a step size sum of 1+2=3 using the collect-and-move method.

Both of the above-described reordering methods are more efficient than, for example, the prior art transpose memory approach. In the 64-state, rate-2/3 example, both direct move and collect-and-move techniques, with step size sums of nine, can perform four-way interleaving of 16 data points using cascaded SEUs with a total of only nine pipelined latches. By comparison, the transpose memory approach would require, for example, a 4×4 memory array, or a total of 16 storage elements. In addition, the reordering techniques of the present invention can reorder path metrics in the 64-state, rate-2/3 case within nine decoder clock cycles without disrupting path metric computation, and thus leave seven of the sixteen total decoder clock cycles in the symbol period for pipelining the path metric computation and distribution.

Figure 4A:
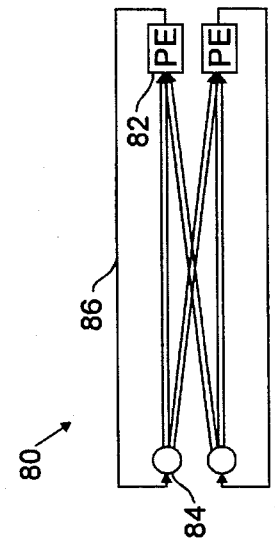

To summarize, an area-efficient decoder architecture was defined above in conjunction with FIGS. 2 through 4. The area-efficient decoders of the present invention use processing elements to compute metrics according to, for example, computation schedules such as those shown in Tables 1 and 3 above. The processing elements also include metric reordering hardware, such as SEUs, for reordering the metrics in accordance with, for example, access schedules such as those shown in Tables 2 and 4. The metric reordering may be accomplished using one of the reordering techniques illustrated in FIGS. 5 and 6. The processing elements 42, 62 and 82 of FIGS. 2(a), 3(a) and 4(a), respectively, may be designed to provide both metric computation and reordering functions, while the corresponding metric output distribution nodes 44, 64, 84 serve to distribute the reordered metrics to the appropriate processing elements.

Figure 7:
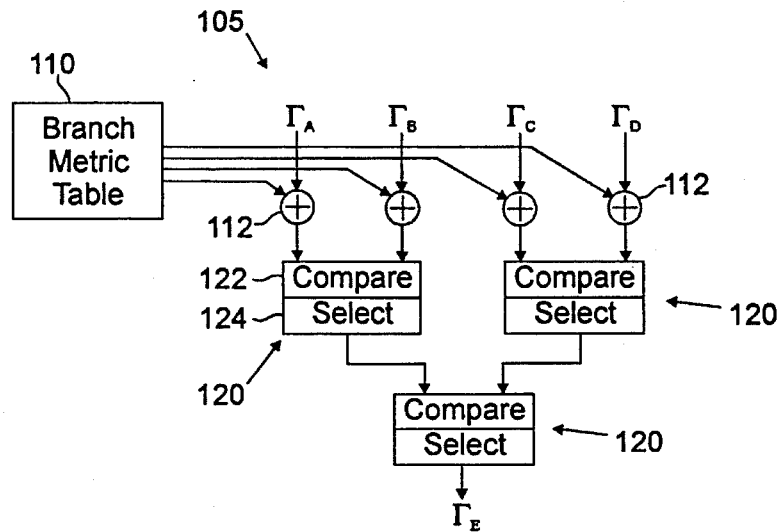
FIG. 7 is a block diagram of a conventional parallel access decoder processing element in accordance with the prior art.

As noted above, prior art decoder processing elements typically access and update previously-computed path metrics in parallel and then select the minimum updated metric as the new path metric for the current trellis node. FIG. 7 shows a prior art processing element 105 which uses parallel metric access. The processing element 105 may be used in a decoder for a rate-k/n convolutional code. In general, for rate-k/n convolutional codes, a parallel access processing element requires $2^k$ parallel metric inputs, $2^k$ adders and $2^k-1$ compare/select units. The processing element 105 thus includes four metric inputs, designated $\Gamma_A$, $\Gamma_B$, $\Gamma_C$ and $\Gamma_D$ in FIG. 7, four adders 112 and three compare/select units 120. Each of the compare/select units 120 includes a comparator 122 and a selector 124. The selector 124 may be, for example, a two-to-one multiplexer. The adder 112 and compare/select unit 120 are often collectively referred to as an add-compare-select (ACS) unit. Each of the adders 112 receives as an input one of the four path metrics. For example, if the processing element 105 is used as PE (0 0) with the access schedule of Table 2, $\Gamma_A$, $\Gamma_B$, $\Gamma_C$ and $\Gamma_D$ correspond to the previously-computed path metrics for states 0, 8, 16 and 24, respectively. The processing element 105 also includes a branch metric table 110 which contains branch metrics indicating the likelihood of a particular state transition given a received code symbol. The branch metrics from table 110 are summed with the previously-computed path metrics in adders 112, the results for adjacent adders are compared in compare/select units 120, and lowest sum is selected as the new path metric. The output of the processing element 105 is thus a new path metric corresponding to a code state having predecessor states with the path metrics $\Gamma_A$, $\Gamma_B$, $\Gamma_C$ and $\Gamma_D$. Again referring to processing element 105 as PE (0 0) in Table 2, if $\Gamma_A$, $\Gamma_B$, $\Gamma_C$ and $\Gamma_D$ are states 0, 8, 16 and 24, respectively, the new path metric $\Gamma_E$ may be a new path metric for state 0. The prior art processing element 105, as described in greater detail above, generally does not provide an area-efficient decoder architecture for high rate codes.

Figure 8:
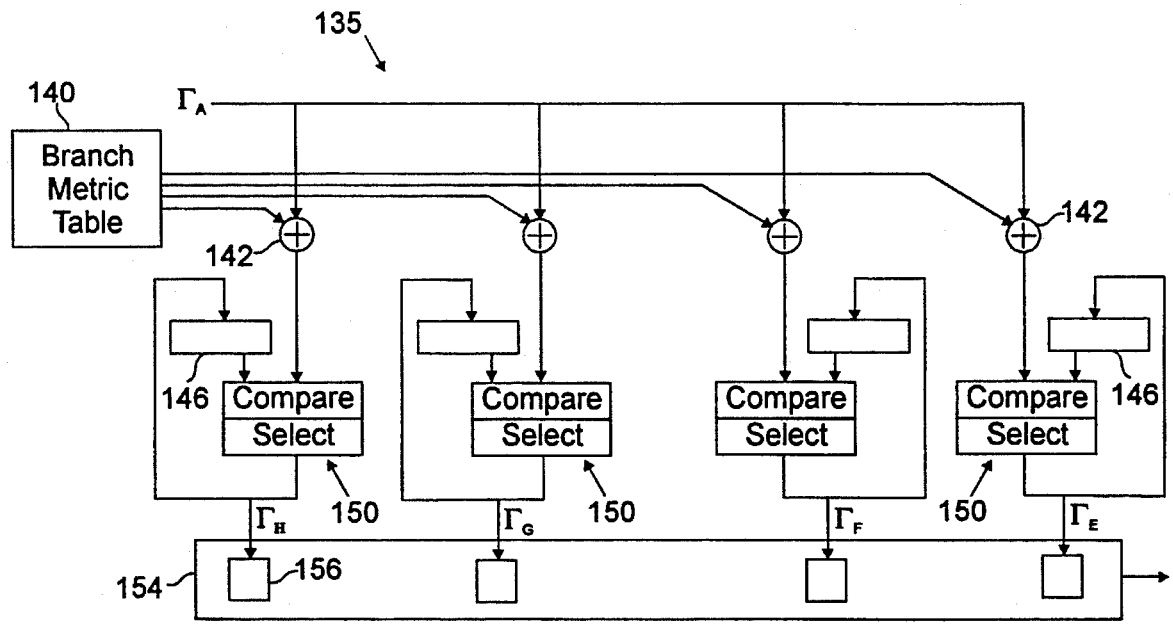
FIG. 8 is a block diagram of an exemplary embodiment of a serial access processing element in accordance with the present invention, suitable for use in the decoders of FIGS. 2, 3 and 4.

FIG. 8 shows a series access processing element 135 in accordance with the present invention. The processing element 135 includes a branch metric table 140 and a number of adders 142. A single previously-computed path metric $\Gamma_A$ is simultaneously supplied via a serial metric input to each of the adders 142, and summed with an appropriate branch metric from table 140. The table 140 may be implemented using any suitable type of memory, and may be stored outside the processing element 105 in other implementations. Compare/select unit 150 compares the output of each adder 142 with the contents of a latch 146. The latch 146 stores partially-computed path metrics while previously-computed path metrics for all possible predecessor states are updated in series. As used herein, a partially-computed path metric refers to a path metric for which all possible previously-computed path metrics have not yet been updated, compared, and selected. For example, referring to Tables 3 and 4 above, PE 0 simultaneously computes path metrics for states 0, 1, 2, and 3 over decoder clock cycles to, t1, t2 and t3, while accessing in series previously-computed path metrics for states 0, 8, 16, and 24. During decoder clock cycle t0, for example, only the previously-computed path metric for state 0 is accessed. Because only one previously-computed path metric is accessed, a new path metric for state 0 cannot be fully computed. The partially-computed metric is therefore stored in the latch 146 until the next decoder clock cycle t1, during which the previously-computed path metric for state 8 is accessed. The partially-computed new path metric for state 0 stored in latch 146 is then processed in compare/select unit 150 with the sum, of the previously-computed metric for state 8 and the appropriate branch metric, from adder 142. The result is again stored in latch 146 as a partially-computed path metric for state 0. When the previously-computed path metrics for states 0, 8, 16 and 24 have all been accessed after decoder clock cycle t3, the new path metrics for states 0, 1, 2 and 3 are all fully computed.

The path metrics computed in processing element 135 are labelled $\Gamma_H$, $\Gamma_G$, $\Gamma_F$ and $\Gamma_E$, may correspond to new path metrics for states 0, 1, 2, and 3 in the example of PE 0 in Tables 3 and 4. While these new path metrics are computed, the input path metric $F_A$ represents previously-computed path metrics for code states 0, 8, 16 and 24 over decoder clock cycles t0, t1, t2 and t3, respectively. When fully computed, each of these new path metrics may be loaded into a metric reordering means 154 having a number of SEUs 156 contained therein, in which metric reordering may be performed in the manner described above. The metric reordering ensures that the metrics computed by processing element 135 are properly accessed by other processing elements in the decoder. The serial access processing element 135 uses only a single metric input, $2^k$ adders and $2^k$ compare/select units. In addition, $2^k$ latches are used for storage of partially-computed path metrics, because the four metrics are computed using serial access to one previously-computed path metric at a time. The loading of new path metrics $\Gamma_E$, $\Gamma_F$, $\Gamma_G$ and $\Gamma_H$ into the SEUs 156 may be used to facilitate metric reordering in certain applications, depending on the code structure, by placing the metrics in a more appropriate initial order.

Figure 9:
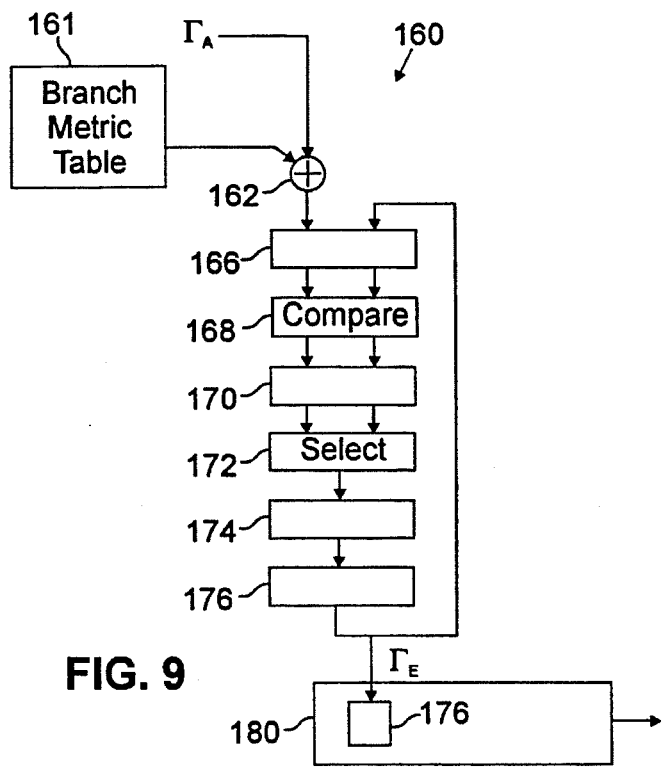
FIG. 9 is a block diagram of another exemplary embodiment of a serial access processing element in accordance with the present invention, suitable for use in the decoders of FIGS. 2, 3 and 4.

FIG. 9 shows another embodiment of a serial access processing element in accordance with the present invention. A processing element 160 includes a branch metric table 161, a serial metric input for providing a previously-computed path metric $\Gamma_A$ to the processing element 160 in series, and a single adder 162. The processing element 160 uses pipelined latches to combine the functions of the multiple adders and compare/select units in the decoder embodiment of FIG. 8. The adder 162 adds previously-computed path metric $\Gamma_A$ to an appropriate branch metric from table 161. The pipelined processing element 160 includes a pipeline latch 166 for storing, for example, a partially-computed metric $\Gamma_E$, a comparator 168, a pipeline latch 170 for storing the output of comparator 168, and a two-to-one selector 172 for selecting one of the outputs of the latch 170 in computing new path metrics. An additional pair of pipeline latches 174, 176 are included in the exemplary processing element 160. The latches 174, 176 also store partially-computed path metrics, which are subsequently fed back to latch 166 and used in computing new path metrics. The series arrangement of latches 166, 170, 174 and 176 together store partially-computed path metrics over a number of decoder clock cycles. For example, if processing element 160 is used as PE 0 in Tables 3 and 4, over clock cycles t0, t1, t2 and t3 $\Gamma_A$ will represent the previously-computed path metrics for states 0, 8, 16 and 24, respectively. The four latches 166, 170, 174 and 176 temporarily store the results of the add, compare and select operations over the four decoder clock cycles t0, t1, t2 and t3, until all of the previously-computed path metrics for states 0, 8, 16 and 24 have been accessed. The comparator 168 and selector 172 are disposed within the series arrangement of latches, and use the temporarily stored values to compute, over a number of decoder clock cycles, a set of new path metrics. Of course, the placement of latches within the processing element 160 is exemplary only, and the latches may be arranged in any of a number of alternative ways. For example, the latches 170 and 174 could both be placed before the comparator 168 or after the selector 172.

When fully computed, the new path metrics may be supplied to a metric reordering means 180 which includes at least one SEU 176. The metric reordering means 180 could also include additional SEUs, as well as other types of storage elements, as required for a given application. The processing element 160 is considerably less complex than the prior art rate-k/n processing element 105 shown in FIG. 7. In fact, the complexity of the processing element 160 is on the order of that of a conventional processing element for a rate-1/n decoder.

Figure 10B:
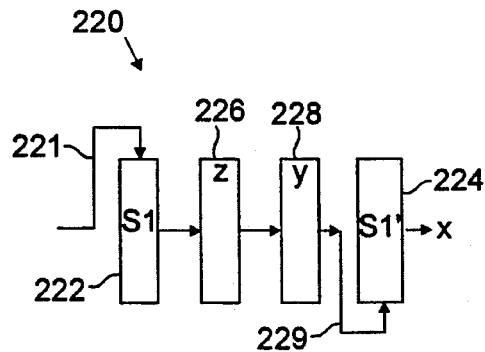
FIGS. 10(a) to 10(c) illustrate exemplary shift exchange units (SEUs), providing permutations of step size 2, suitable for use in the processing elements of FIGS. 8 and 9.
Figure 10A:
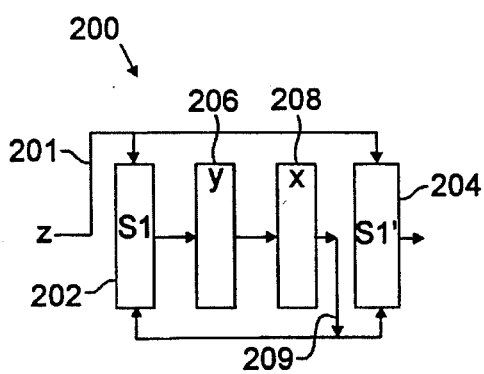
Figure 10C:
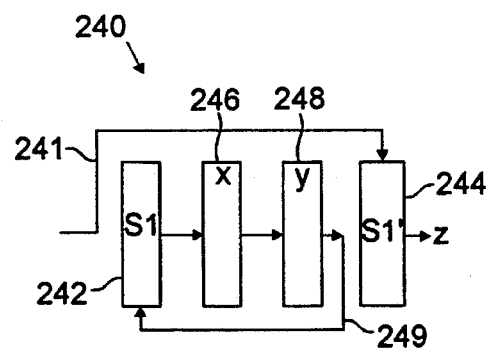

FIGS. 10(a) to 10(c) show exemplary SEUs suitable for use in the processing elements of FIGS. 8 and 9. FIG. 10(a) shows an SEU 200 with a path metric input 201, selectors 202, 204, a pair of pipeline latches 206, 208, and a pipeline output 209 which provides another input to the selectors 202, 204. Each of the selectors 202, 204 is designed to select which of two inputs will pass to its output, depending on external control signals applied to the selectors. For example, selector 202 may be configured to pass data from either line 201 or line 209 to its output, which drives latch 206. The selectors operate in a complementary manner, such that if a selector S1 is configured to select its upper input, the corresponding selector S1' is configured to select its lower input, and vice versa. The input to the exemplary SEU 200 is a sequence of metrics [x, y, z]. Latch 208 contains metric x, latch 206 contains metric y, and metric z is present on the SEU input 201. By applying appropriate external control signals to the selectors, the exemplary SEU 200 may be configured to, for example, preserve the relative order of the metrics [x, y, z] or change the order to [z, x, y]. FIG. 10(b)

shows a configuration of an SEU 220 in which selector 224 selects the latch output 229, and as a result, metric x is supplied to the SEU 220 output, while metric y is latched into latch 228 and metric z is latched into latch 226. The SEU 220 is thus in a configuration which preserves the order of the metrics. FIG. 10(c) shows an SEU 240 in which selector 242 selects the latch output 249. As a result, metric z is applied via line 241 to a selector 2244 and from there to the SEU 240 output. At the same time, metric x is stored in latch 246, and metric y is shifted into latch 248. The SEU 240 thus serves to convert the input metric order from [x, y, z] to [z, x, y], and therefore provides fixed-step permutations of step size two.

Alternatives to pipelined SEUs for implementing metric reordering include data format converters described in, for example, K. Parhi, "Systematic Synthesis of DSP Data Format Converters Using Life-Time Analysis and Forward-Backward Register Allocation," IEEE Trans. on Circuits and Systems, Vol. 39, No 7, pp. 423–440, July 1992, and K. Parhi, "Video Data Format Converters Using Minimum Number of Registers," IEEE Trans. on Circuits and Systems for Video Technology, Vol. 2, No. 2, pp. 255–267, June 1992, both of which are incorporated by reference herein.

Although the foregoing detailed description has described the present invention primarily in the context of rate-k/n convolutional codes, it should be understood that other types of codes having trellis-like state transitions may also be used. Many variations may be made in the arrangements shown, including, for example, the use of different techniques to assign code states to processing elements, applying different amounts of time offset in the path metric computation and access schedules, using other metric reordering techniques, and altering the structure and interconnection of the decoder processing elements. In addition, the metric reordering techniques disclosed herein are well-suited for use in interleave coding, and the processing element structures may be used in other decoding applications. These and other alternatives and variations in the arrangements shown will be readily apparent to those skilled in the art, and the present invention is therefore limited only by the appended claims.

What is claimed is:

1. A method of decoding a stream of code symbols encoded using a high rate trellis code, said method comprising the steps of:

providing a decoder having a plurality of processing elements;

assigning at least one different code state of said high rate trellis code to each of said processing elements, such that each of said processing elements computes new path metrics for each of said code states assigned thereto;

scheduling computation of said new path metrics for a current code symbol within each of said processing elements, said computation based on updating previously-computed path metrics, computed for a previous code symbol, using branch metrics which vary with said current code symbol;

scheduling access for each of said processing elements to one of a number of sets of said previously-computed path metrics, said set including, for a given processing element, previously-computed path metrics for predecessor code states of said code states assigned to said processing element, such that a given processing element accesses each of said previously-computed path metrics in said set in series;

computing said new path metrics for each of said code states as each of said code symbols is received in said decoder, using a computation schedule and an access schedule determined in said steps of scheduling computation and scheduling access, respectively, such that said new path metrics computed for said previous code symbol serve as previously-computed path metrics in computing new path metrics for said current code symbol; and using a survivor sequence of said path metrics to estimate uncoded data symbols corresponding to said code symbols.

2. The method of claim 1 further including the step of reordering said new path metrics in order to facilitate said scheduled access for subsequent path metric computations.

3. The method of claim 1 wherein said decoder includes a quantity $2^i$ of said processing elements and said step of assigning said code states to said processing elements further includes assigning to each of said processing elements a group of said code states having a common set of i bits in binary representations thereof.

4. The method of claim 1 wherein said high rate trellis code is a rate-k/n convolutional code.

5. The method of claim 1 wherein said decoder includes a quantity $2^i$ of said processing elements and further wherein said steps of scheduling computation of and access to said path metrics include offsetting by i decoder clock cycles the computation of and access to said path metrics by each of said $2^i$ processing elements, in order to provide each of said processing elements with series access to said set of previously-computed path metrics.

6. The method of claim 1 wherein said step of scheduling computation of said new path metrics further includes scheduling computation of said new path metrics in ascending order of said code states.

7. The method of claim 2 wherein said step of reordering said path metrics further includes the steps of:

dividing a set of data points corresponding to said path metrics into a number of slots, each of said slots having a slot size corresponding to a number of slot positions in each slot;

applying permutations to said data points such that data points occupying incorrect slot positions are moved to a different slot position; and repeating said steps of dividing said data points into a number of slots and applying permutations, using a different slot size, until a desired sequential ordering of said data points is obtained.

8. The method of claim 7 wherein said step of applying permutations to said data points further includes directly moving said data points occupying incorrect slot positions in one of said slots to different slot positions in another of said slots.

9. The method of claim 7 wherein said step of applying permutations to said data points further includes the steps of:

collecting said data points occupying incorrect slot positions in temporary slot positions near a boundary separating two of said slots, by switching said data points in said incorrect slot positions with data points in said temporary slot positions; and moving said data points in said temporary slot positions in one of said slots to different slot positions in another of said slots.

10. A decoder for decoding a stream of code symbols encoded using a high rate trellis code, said decoder comprising:

a plurality of processing elements, each of said processing elements having at least one code state of said code assigned thereto, such that each of said processing elements computes new path metrics for each of said code states assigned thereto, said new path metrics computed by updating previously-computed path metrics using branch metrics which vary with said code symbols; and a plurality of path metric distribution nodes for distributing an output of each of said processing elements to other of said processing elements in accordance with path metric computation and access schedules, such that each of said processing elements has series access to an appropriate set of said previously-computed path metrics, said set including, for a given processing element, previously-computed path metrics for predecessor code states of said code states assigned to said processing element.

11. The decoder of claim 10 wherein said plurality of processing elements includes $2^i$ processing elements, and further wherein groups of said code states having a common set of i bits in binary representations thereof are assigned to each of said $2^i$ processing elements.

12. The decoder of claim 10 wherein said code is a rate-k/n convolutional code.

13. The decoder of claim 10 wherein said plurality of processing elements includes $2^i$ processing elements and further wherein each of said processing elements are provided with said serial access by offsetting by i decoder clock cycles the computation of and access to said previously-computed path metrics by each of said $2^i$ processing elements.

14. The decoder of claim 10 wherein said processing element includes:

a serial metric input for providing said previously-computed path metrics to said processing element in series;

a plurality of adders for adding one of said previously-computed path metrics to one of a plurality of said branch metrics;

a plurality of latches for storing partially-computed path metrics within said processing element; and a plurality of compare/select units for comparing an output of at least one of said adders and an output of one of said latches, and selecting one of said outputs as a new path metric.

15. The decoder of claim 14 wherein said processing element further includes a metric reordering means having a number of shift exchange units therein for reordering said new path metrics computed in said processing element.

16. The decoder of claim 10 wherein said processing element includes:

a serial metric input for providing said previously-computed path metrics to said processing element in series;

an adder for adding one of said previously-computed path metrics to one of said branch metrics;

a plurality of latches arranged in series for temporarily storing partially-computed path metrics for a plurality of decoder clock cycles; and a comparator and a selector disposed within said series arrangement of latches, such that said new path metrics may be computed over said plurality of clock cycles using values stored in said latches.

17. The decoder of claim 16 wherein said processing element further includes a metric reordering means having a number of shift exchange units therein for reordering said path metrics computed in said processing element.

* * * * *